US012577434B2

(12) United States Patent
Fournel et al.

(10) Patent No.: US 12,577,434 B2
(45) Date of Patent: Mar. 17, 2026

(54) METHOD FOR BONDING TWO HYDROPHILIC SURFACES

(71) Applicant: COMMISSARIAT À L'ENERGIE ATOMIQUE ET AUX ÉNERGIES ALTERNATIVES, Paris (FR)

(72) Inventors: Frank Fournel, Grenoble (FR); Aziliz Calvez, Grenoble (FR); Gaelle Eleouet, Grenoble (FR); Vincent Larrey, Grenoble (FR); Christophe Morales, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 197 days.

(21) Appl. No.: 17/755,450

(22) PCT Filed: Oct. 20, 2020

(86) PCT No.: PCT/FR2020/051888
§ 371 (c)(1),
(2) Date: Apr. 29, 2022

(87) PCT Pub. No.: WO2021/084188
PCT Pub. Date: May 6, 2021

(65) Prior Publication Data
US 2024/0150617 A1 May 9, 2024

(30) Foreign Application Priority Data
Oct. 31, 2019 (FR) ........................................ 1912269

(51) Int. Cl.
*H01L 21/18* (2006.01)
*C09J 5/02* (2006.01)
*C09J 5/06* (2006.01)

(52) U.S. Cl.
CPC . *C09J 5/02* (2013.01); *C09J 5/06* (2013.01); *H01L 21/187* (2013.01)

(58) Field of Classification Search
CPC ............. H01L 21/02065; H01L 21/187; H01L 21/2007; H01L 21/02164; H01L 21/02046
See application file for complete search history.

(56) References Cited

U.S. PATENT DOCUMENTS 5,611,885 A * 3/1997 Hansen ............... D06M 13/184
156/336
2014/0295642 A1* 10/2014 Fournel ............... H01L 31/1892
257/629

(Continued)

FOREIGN PATENT DOCUMENTS

EP 2750166 A1 7/2014
WO 2013060726 A1 5/2013
WO 2015107290 A2 7/2015

OTHER PUBLICATIONS

International Search Report for PCT/FR2020/051888 dated Dec. 23, 2020 and translation thereof.

(Continued)

*Primary Examiner* — Scott W Dodds
(74) *Attorney, Agent, or Firm* — Chrisman Gallo Tochtrop LLC

(57) ABSTRACT

A method of direct bonding comprising the following steps: supplying a first substrate and a second substrate, the first substrate being covered by a first hydrophilic surface and the second substrate being covered by a second hydrophilic surface, deposition of a specific molecule on the first hydrophilic surface and/or on the second hydrophilic surface, the specific molecule comprising a hydrophilic functional group and a basic functional group, separated by at least one atom, contacting the first hydrophilic surface with the second hydrophilic surface, whereby the two hydrophilic surfaces (Continued)

are bonded one with the other, and the first substrate and the second substrate are assembled, optionally, application of a bonding annealing heat treatment, preferably at a temperature less than or equal to 500° C.

19 Claims, 3 Drawing Sheets

(56) References Cited

U.S. PATENT DOCUMENTS

2017/0369315 A1 * 12/2017 Alvarez, Jr. ........... B01D 63/06
2020/0131376 A1 * 4/2020 Tokunaga ................ C09D 7/63

OTHER PUBLICATIONS

Written Opinion for PCT/FR2020/051888 dated Dec. 23, 2020.
Search Report for French application No. 1912269 dated Jul. 21, 2020.

* cited by examiner

METHOD FOR BONDING TWO HYDROPHILIC SURFACES

CROSS-REFERENCE TO RELATED APPLICATIONS

This is a National Stage application of PCT international application PCT/FR2020/051888, filed on Oct. 20, 2020, which claims the priority of French Patent Application No. 1912269, filed Oct. 31, 2019, both of which are incorporated herein by reference in their entirety.

TECHNICAL FIELD

The invention relates to a method of direct bonding of two hydrophilic surfaces as well as an assembly obtained with such a method.

The invention has applications in many industrial fields, and in particular for the manufacture of silicon on insulator (SOI) or for the production of imager for example.

The invention is particularly interesting since it makes it possible to obtain an assembly that has good mechanical resistance, for low thermal annealing budgets after bonding.

PRIOR ART

Direct bonding is a spontaneous bonding between two surfaces without adding any material, and in particular without adding a thick layer of liquid material or polymer. It is however possible to have a few single-layers of water adsorbed on the surfaces to be bonded in particular if they are hydrophilic but the latter are macroscopically dry. Direct bonding is conventionally carried out at ambient temperature and ambient pressure, but this is not an obligation. For a $SiO_2$—$SiO_2$ bonding, the surfaces to be bonded are generally cleaned beforehand with a solution with a Caro acid base obtained with a mixture of sulphuric acid 96% and oxygenated water 30% (3:1) at 180° C. and of SC1 (mixture of ammonia 30%, oxygenated water 30% and of deionised water (1:1:5)) at 70° C. These cleanings make it possible to remove the organic and particulate contamination that is highly detrimental to direct bonding. Alternatively, it is possible to use other highly oxidising cleaning solutions such as, for example, aqueous solutions containing ozone or with a treatment using exposure to UV light in the presence of gaseous ozone.

Direct bonding can be characterised by:
- the bonding energy (also called adherence energy): this is the energy required to separate the two bonded surfaces; the bonding energy changes according to the thermal annealing that is applied after the bonding,
- the adhesion energy: this is the energy available to carry out spontaneous bonding. This is the energy that makes it possible to deform the two surfaces in order to bring them into contact on an atomic scale with the assistance of the Van der Waals forces.

For example, for two surfaces of hydrophilic silicon oxide or silicon, the adhesion energy typically ranges from 30 to 100 $mJ/m^2$. The adherence energy of a $SiO_2$—$SiO_2$ bonding, in a cleanroom ambiance, with a chemical cleaning with a base of Caro and of SC1 at 70° C., is about 140 $mJ/m^2$ just after bonding, without annealing. For a bonding the adherence energy increases according to the temperature of the thermal annealings. For example, the bonding energy slowly rises to reach 3$J/m^2$ at 500° C. and then stagnates until 800° C. (FIG. 1).

To increase the bonding energy, a solution consists of carrying out a plasma treatment. As shown in FIG. 1, with a nitrogen plasma ($N_2$), for an oxide-oxide bonding, the bonding energy quickly rises to 5 $J/m^2$ for an annealing temperature of 300° C.

However, using a plasma can be incompatible with certain substrates and/or using it extends the time and/or costs of the methods, which makes them more difficult to industrialise. Plasma treatment also modifies the surface over a thickness of a few nanometres (between 1 and 10 nm). This modification can disturb future devices. For example, with a silicon plate, the plasma creates a layer of oxide that is difficult to control in terms of thickness and quality. With a silicon oxide surface, certain plasmas such as the $N_2$ plasma create interfacial charge problems that can disturb the electrical operation of future devices.

DISCLOSURE OF THE INVENTION

A purpose of the present invention is to overcome the disadvantages of the prior art and to propose a method for bonding that makes it possible to obtain a strong bonding energy at low temperature (typically less than or equal to 500° C. and preferably less than or equal to 300° C.) without using plasma treatment.

For this, the present invention proposes a method of direct bonding of two substrates comprising the following steps:
- supplying a first substrate and a second substrate, the first substrate being covered by a first hydrophilic surface and the second substrate being covered by a second hydrophilic surface,
- deposition of a specific molecule on the first hydrophilic surface of the first substrate and/or on the second hydrophilic surface of the second substrate, the specific molecule comprising a hydrophilic functional group and a basic functional group, separated by at least one atom,
- contacting the first hydrophilic surface with the second hydrophilic surface, whereby the first substrate and the second substrate are assembled by bonding of the first hydrophilic surface and the second hydrophilic surface,
- optionally, application of a bonding annealing heat treatment, preferably at a temperature less than or equal to 500° C., and even more preferably less than or equal to 300° C.

The invention is fundamentally distinguished from the prior art by the use of a specific molecule comprising a hydrophilic functional group and a basic functional group. The hydrophilic functional group allows the specific molecule to be chemisorbed easily on the hydrophilic surface to be bonded. The basic functional group makes it possible to increase the pH of the single-layers of water adsorbed. The presence of this molecule substantially increases the bonding energy obtained.

"Hydrophilic surface" means that at least one single-layer of water is adsorbed at its surface at ambient pressure (i.e. of about 1 bar) in air that has at least 1% relative humidity. A surface is said to be hydrophilic if the angle of a drop of water is less than 90° and preferably less than 50° C., and even more preferably less than 5°.

Preferably, the first hydrophilic surface and the second hydrophilic surface are made of oxide. This can be a thin layer of oxide deposited, a thin layer of oxide obtained by a thermal treatment (also called thermal oxide) and/or a thin layer of oxide obtained by a chemical treatment (also called native oxide or chemical oxide).

According to a first advantageous alternative embodiment, the specific molecule completely covers the first hydrophilic surface of the first substrate and/or the second hydrophilic surface of the second substrate. There are, advantageously, from 1 to 5 layers of specific molecule on the hydrophilic surface. Advantageously there is only one single-layer.

According to a second advantageous alternative embodiment, the specific molecule covers from 0.05% to 10%, and preferably from 0.05% to 1%, of the first hydrophilic surface of the first substrate and/or of the second hydrophilic surface of the second substrate.

According to a first advantageous embodiment alternative, the specific molecule is deposited in liquid form.

According to a second advantageous embodiment alternative, the specific molecule is deposited in gaseous form.

Advantageously, the hydrophilic functional group of the specific molecule is an alcohol function and/or the basic functional group is a primary, secondary or tertiary amine.

Advantageously, the molar mass of the specific molecule is less than or equal to 500 g/mol and preferably less than or equal to 200 g/mol.

Advantageously, the first substrate and/or the second substrate are silicon substrates. The substrate or substrates are covered by a thin layer of silicon oxide. The layer of oxide can be a deposited layer, a layer of thermal oxide or a layer of native oxide.

The method for bonding has many advantages:

surface preparation is carried out with the specific molecule in liquid or gaseous form: the method is simple to implement and therefore can be industrialised easily, a small quantity of specific molecule is sufficient to ensure strong bonding, the method can be applied to many materials and is inexpensive, using the molecule does not decrease the adhesion energy, there is no formation of bubbles, disbonding and/or defects at the bonding interface, even after a thermal treatment, the bonding temperatures are compatible with many applications and/or with many substrates (of which the nature and/or the presence of electronic and/or optoelectronic components require low thermal budgets), the method leads to assembled structures that have good mechanical resistance after bonding, compatible with later methods such as Smart Cut and/or any method that generates mechanical stresses on the assembly, such as for example a mechanical thinning.

The invention also relates to an assembly comprising a first substrate and a second substrate, the first substrate being covered by a first hydrophilic surface and the second substrate being covered by a second hydrophilic surface, a specific molecule being disposed between the first hydrophilic surface of the first substrate and the second hydrophilic surface of the second substrate, the specific molecule comprising a hydrophilic functional group and a basic functional group, the two functional groups of the specific molecule being separated by at least one atom.

Advantageously, the hydrophilic functional group of the specific molecule is an alcohol function and/or the basic functional group is a primary, secondary or tertiary amine.

Other characteristics and advantages of the invention shall appear from the following supplemental description.

It goes without saying that this supplemental description is provided only for the purpose of illustrating the purpose of the invention and must not in any case be interpreted as a limitation of this purpose.

BRIEF DESCRIPTION OF THE DRAWINGS

The present invention shall be better understood when reading the description of embodiments given solely for the purposes of information and in a non-limiting manner, in reference to the accompanying drawings wherein.

The different portions shown in the figures are not necessarily shown according to a uniform scale, in order to make the figures more legible.

The various possibilities (alternatives and embodiments) must be understood as not being exclusive from one another and can be combined together;

Furthermore, in the description hereinafter, terms that depend on the orientation, such as "on", "under", etc. of a structure are applied by considering that the structure is oriented in the manner shown in the figures.

DETAILED DISCLOSURE OF PARTICULAR EMBODIMENTS

Although this is in no way a limitation, the invention has applications particularly in the field of manufacturing SOI and imager.

The method is a method of direct bonding of two substrates 10, 20, and more particularly it is a method of direct bonding of two hydrophilic surfaces, for example with oxide.

Figure 1:
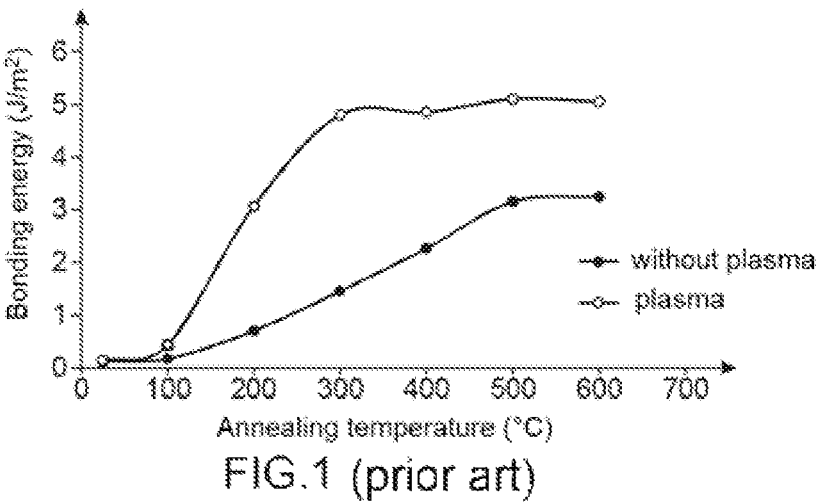
FIG. 1 described hereinabove, is a graph showing the bonding energy according to the thermal annealing temperature carried out after a direct bonding with or without plasma activation, each thermal annealing lasts about 2 h, according to the prior art.
Figure 2:
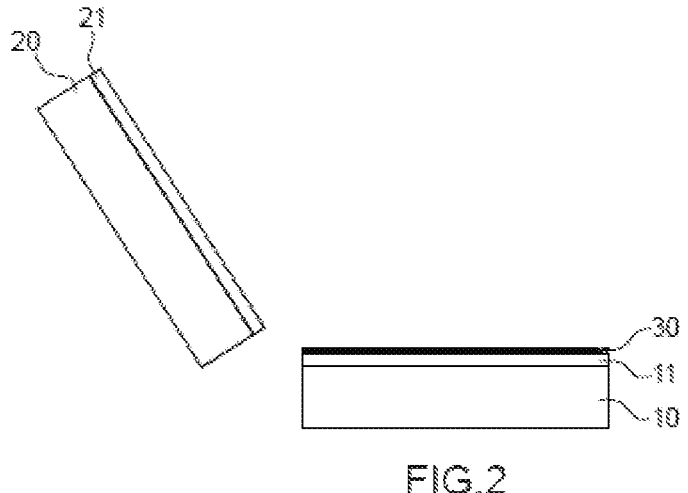
FIG. 2 diagrammatically shows, as a cross-section, two substrates to be assembled by direct bonding, with one of the substrates being covered by a specific molecule, according to a particular embodiment of the invention.

The method includes the following steps:

a) supplying a first substrate 10 and a second substrate 20, the first substrate 10 being covered by a first hydrophilic surface 11, and the second substrate 20 being covered by a second hydrophilic surface 21, b) adding of a specific molecule 30 on the first hydrophilic surface of the first substrate and/or on the second hydrophilic surface of the second substrate, the specific molecule 30 comprising a hydrophilic functional group and a basic functional group, the two functional groups of the specific molecule being separated by at least one atom, c) contacting the first hydrophilic surface 11 with the second hydrophilic surface 21, whereby the two hydrophilic surfaces 11, 21 are bonded to one another, and the first substrate 10 and the second substrate 20 are assembled, Each substrate 10, 20 provided in step a) comprises two main faces parallel to one another. At least one of the main faces of each substrate is covered by a hydrophilic surface 11, 21 (FIG. 2).

The first substrate 10 and/or the second substrate 20 can be made of silica, metal, metal alloy or a semi-conductor material.

Preferably, the first substrate 10 and/or the second substrate 20 are made of a material chosen from Si, Ge, InP, AsGa, $Al_2O_3$, $SiO_2$, $Si_3N_4$, SiC, GaN, LNO, LTO, Cu, Ti, Ni. The first substrate and the second can be of an identical nature or of different natures.

The first substrate 10 and the second substrate 20 are covered by a hydrophilic surface 11, 21, i.e. there is at least one single-layer of water adsorbed on their surface.

Preferably, the first substrate 10 is covered by a first thin layer of oxide in such a way as to form a first hydrophilic surface and the second substrate 20 is covered by a second thin layer of oxide in such a way as to form a second hydrophilic surface.

For example, the first substrate 10 and the second substrate 20 are covered by a layer of native oxide or by a layer of thermal oxide.

According to a first alternative embodiment, one of the substrates can be covered by a layer of native oxide and the other by a layer of thermal oxide.

According to another alternative embodiment, the two substrates can be covered by a layer of thermal oxide.

According to another alternative embodiment, the two substrates can be covered by a layer of native oxide.

In all these alternatives, the layer of thermal oxide can be replaced with a deposited layer of oxide.

Advantageously, before step b), one or more pre-treatments can be carried out, for example mechanical and/or chemical. For example, for the silicon and its oxide, advantageously, a chemical cleaning with a base of Caro's acid obtained with a mixture of sulphuric acid 96%, oxygenated water 30% (3:1) at 180° C. and of SC1 (mixture of ammonia 30%, oxygenated water 30% and deionised water (1:1:5)) will be used, for example, at a temperature of 70° C. Other cleanings can be considered.

The substrates 10, 20 are, preferably, wafers.

During step b), the specific molecule 30 is deposited in order to improve the bonding.

The specific molecule 30 is an organic molecule. It includes a hydrophilic functional group and a basic functional group, separated by at least one atom. In other words, the two functional groups are not on the same atom, for example, they are not on the same carbon atom.

"Basic functional group" means that the specific molecule 30 comprises a group that can protonate. Preferably, the basic group is a primary amine, a secondary amine or a tertiary amine. It could also be a group deriving from the ionisation of an acid functional group, for example from the ionisation of a functional group, for example from the sulphonic group $SO_3H$, leading to $—SO_3^-$. It is also possible to have an alcoholate group ($R—O^-$) for this basic function.

The hydrophilic functional group is, for example, a hydroxyl functional group, ether, amide, ester or ketone.

The hydrophilic functional group is, preferably, a hydroxyl functional group (also called alcohol function). This can be a primary, secondary or tertiary alcohol.

Even more preferably, the hydrophilic functional group is a hydroxyl functional group and the basic functional group is a primary, secondary or tertiary amine.

The specific molecule 30 can comprise several acid functional groups and/or several basic functional groups.

Preferably, the molecule comprises a basic functional group and at least one hydroxyl functional group. For example, it comprises a basic functional group and one, two or three hydrophilic functional groups.

The specific molecule 30 can be cyclic or acyclic. Preferably, it is acyclic. When the molecule includes an open carbon chain, the latter can be linear or branched. It includes, preferably, from 1 to 10 carbon atoms and even more preferably from 1 to 6 carbon atoms.

Advantageously, the molecular weight of the specific molecule 30 is less than or equal to 500 g/mol and preferably less than or equal to 200 g/mol. It is, advantageously, greater than 40 g/mol.

For the purpose of illustration and in a non-limiting manner, the specific molecule 30 is chosen from: N,N-Diethyl-2-amino-ethanol (CAS: 100-37-8), dimethylamino-ethanol or DMAE (CAS:108-01-0), diethylethanolamine or DEAE (CAS 100-37-8), monoethanolamine (CAS: 141-43-5), N-methyldiethanolamine, or MDEA (CAS: 105-59-9), aminomethanol (CAS: 3088-27-5), N-methylhydroxylamine (CAS:593-77-1), diethanolamine or DEA (CAS: 111-42-2), dimethanolamine (CAS: 7487-32-3), triethanolamine (CAS: 102-71-6) and trimethanolamine (CAS: 14002-32-5).

The specific molecule 30 can be deposited:

on the hydrophilic surface 11 of the first substrate 10, or on the hydrophilic surface 12 of the second substrate 20, or both on the hydrophilic surface 11 of the first substrate 10 and on the hydrophilic surface 21 of the second substrate 20.

The specific molecule 30 can be deposited in liquid form and/or in gaseous form.

A pure solution of specific molecule or a diluted solution of specific molecule can be used.

It is possible, advantageously, to add a base to the solution in order to increase the pH. For example, KOH, NaOH, $Na_2CO_3$, or $NH_4OH$ can be used.

To deposit the specific molecule 30 in liquid form, any liquid deposition technique can be used, for example, by coating, by spraying, by spin-coating deposition.

Preferably, spin-coating deposition is used.

To deposit the specific molecule 30 in gaseous form, a substrate is placed in a closed enclosure, wherein a recipient is disposed containing a solution of the specific molecule (pure or diluted). Then the solution is left to evaporate in the closed reactor.

The specific molecule 30 can entirely or partially cover the surface on which it is deposited.

The quantity deposited can be such that a continuous single-layer is formed on the hydrophilic surface (saturation of the surface). It is also possible to have several single-layers on the surface, for example there can be up to 5 single-layers on the surface.

"Partially" means in particular less than 50%, and preferably less than 10%. Even more preferably, the specific molecule covers less than 1%, even less than 0.1% of the surface to be bonded. Advantageously, it covers at least 0.05% of the surface to be bonded. According to a particularly advantageous embodiment, it covers from 0.05% to 1% of the surface to be bonded, and even more preferably from 0.05% to 0.1%.

During step c), the surfaces to be bonded (i.e. the hydrophilic surfaces 11, 21) are contacted, whereby an assembly is obtained comprising two substrates 10, 20 bonded to each other at their hydrophilic surfaces 11, 21. Step c) is preferably carried out at ambient temperature (i.e. at a temperature of about 20° C.).

The specific molecule 30 remains attached on the hydrophilic surface or surfaces 11, 21 and is enclosed at the bonding interface. It is trapped in the assembly and cannot evaporate.

The assembly thus obtained comprises two substrates 10, 20, each covered by a hydrophilic surface 11, 21, the specific molecule 30 such as defined hereinabove being disposed between the two hydrophilic surfaces.

The method can comprise a later step during which a thermal annealing is carried out after bonding. The thermal annealing after bonding makes it possible to reinforce the direct bonding obtained in step c). The temperature of the thermal annealing ranges, for example, from 100° C. to 1200° C. Preferably, the temperature ranges from 100° C. to 500° C., and even more preferably from 100° C. to 300° C.

The bonding energies of the assembly, after annealing, range from 600 mJ to 5000 mJ according to the temperature of the thermal annealing. For example, for a temperature of 300° C., the bonding energy ranges from 3500 mJ to 4000 mJ.

Illustrative and Non-Limiting Examples of an Embodiment

In the various embodiments that shall be described, the plates are silicon plates 200 mm in diameter and 725 μm thick. They were thermally oxidised in order to obtain on the surface a silicon oxide film 145 nm thick. They are then cleaned with ozonated water and with SC1 followed by a SC2 (mixture of hydrochloric acid 30%, oxygenated water 30% and water 1:1:5) to make their surfaces hydrophilic.

The specific molecule for the bonding here is N,N-Diethyl-2-amino-ethanol (CAS: 100-37-8).

Example 1: Saturation of the Surface

In a reactor having a volume of about 50 or 100 L, a beaker is placed containing 10 mL of the pure specific molecule (not diluted). The solution is left to evaporate in the closed reactor for 1 h30. Then, two silicon plates are placed in this atmosphere for 3 min and then they are bonded. The bonding wave is then about 8 s to pass through the 200 mm which is equivalent to the bonding without this molecule.

Figure 3:
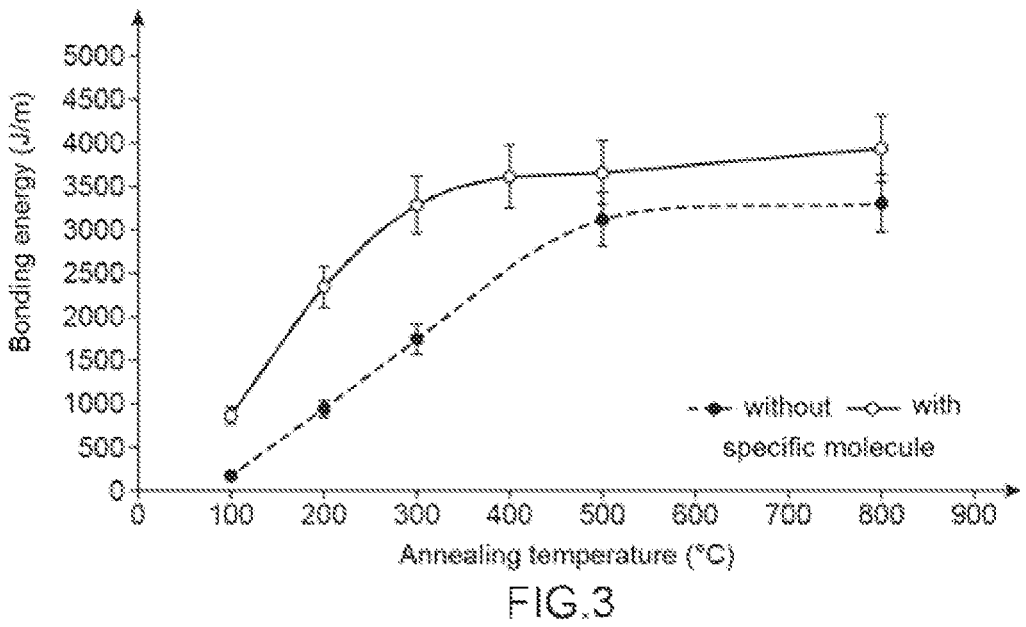
FIG. 3 is a graph showing the bonding energy according to the thermal annealing carried out after bonding, when the surface of the layer of oxide of one of the substrates is saturated by a specific molecule, according to a particular embodiment of the invention.

The bonding is annealed and the adherence energies are measured at different temperatures. The bonding energy obtained with the specific molecule is more substantial than without the specific molecule (FIG. 3). On the other hand, as the surface is quickly saturated, there is no dependency with exposure time: the same results are obtained for durations of 30 s, 8 min or 15 min of exposure.

Example 2: Partial Saturation of the Surface

In a reactor having a volume of about 50 or 100 L, a beaker containing 1 mL of water and 0.02 mL of the specific molecule is placed. The solution is left to evaporate in the closed reactor for 1 h30. Then the two silicon plates are placed in this atmosphere for 1 min and then they are bonded. The bonding wave is then about 8 s to pass through the 200 mm which is equivalent to the bonding without this molecule.

Figure 4:
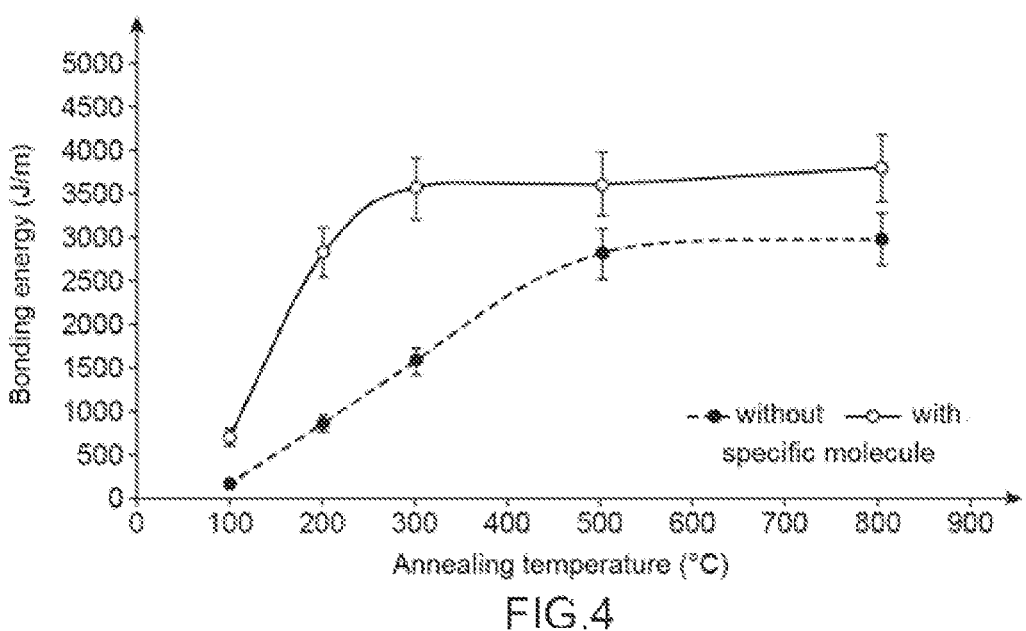
FIG. 4 is a graph showing the bonding energy according to the thermal annealing carried out after bonding, when the surface of the layer of oxide of one of the substrates is covered partially by a specific molecule, according to a particular embodiment of the invention.

The bonding is annealed and the adherence energies are measured at different temperatures. As shown in FIG. 4, the bonding energy obtained with a partial saturation of the surface is more substantial than when the surface is entirely saturated. A lower concentration due to a lower saturation vapour pressure of the diluted solution makes it possible to obtain a better bonding energy for the entire temperature range.

Figure 5:
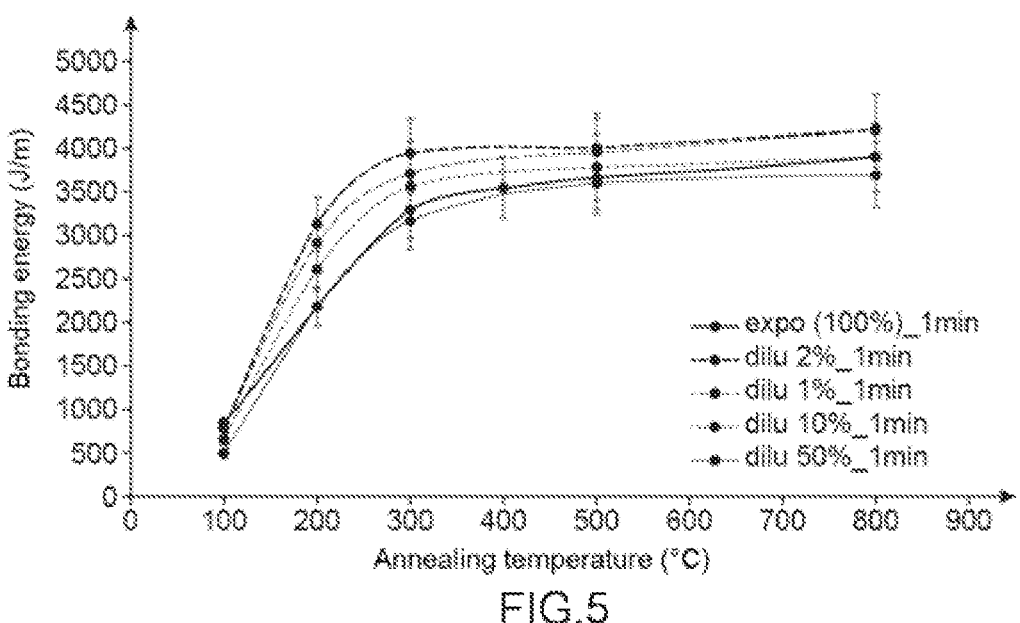
FIG. 5 is a graph showing the bonding energy according to the thermal annealing carried out after bonding, for different volume dilutions of a specific molecule solution, according to a particular embodiment of the invention.

FIG. 5 shows the bonding energy according to the dilution of the solution of specific molecule.

Example 3: Partial Saturation of the Surface from a Liquid Solution

Spin-coating deposition is used to deposit a solution containing 1% by volume of the specific molecule on the surface of a plate: a stream of the water-product mixture is created on the surface that rotates at 30 rpm until the entire surface is covered. Then, the dispensing of the product is stopped and it is rotated at 2000 rpm for 30 s in order to remove the surplus. Then the two plates are bonded. The bonding wave is then about 8 s to pass through the 200 mm which is equivalent to the bonding without this molecule.

The bonding is annealed and the adherence energies are measured at different temperatures, the same results are obtained as for example 2.

Figure 6:
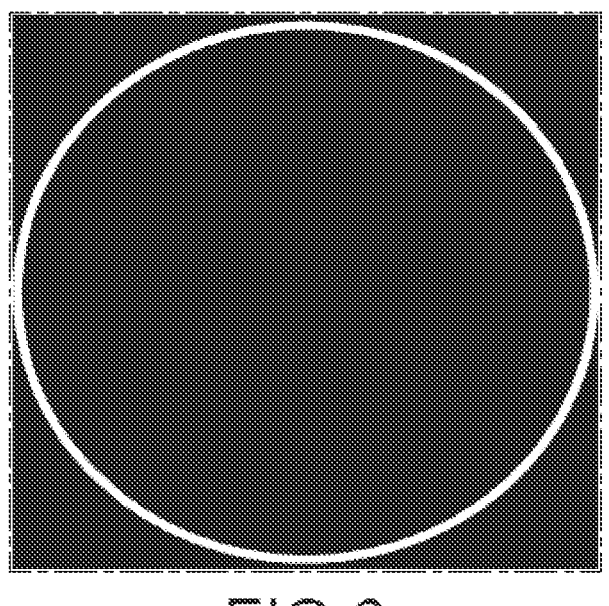
FIG. 6 shows an image, obtained by scanning acoustic microscopy (SAM), of a bonding implementing a specific molecule, after a thermal annealing at 800° C., according to a particular embodiment of the invention.

Observations under the scanning acoustic microscope (SAM) confirm that the bondings are free of defects (FIG. 6).

For the purpose of comparison, the following tests were conducted:

plates were cleaned with isopropyl alcohol vapours, plates were cleaned with isopropyl alcohol vapours then ammonia diluted to 2% was added before bonding them.

No visible effect was observed on the bonding energy.

What is claimed is:

1. A method of direct bonding of two substrates comprising the following steps:

supplying a first substrate and a second substrate, the first substrate being covered by a first hydrophilic surface and the second substrate being covered by a second hydrophilic surface, deposition of a specific molecule on the first hydrophilic surface or on the second hydrophilic surface, the specific molecule comprising a hydrophilic functional group and a basic functional group, separated by at least one atom, wherein the specific molecule is deposited in an amount configured to improve the bonding between the first hydrophilic surface and the second hydrophilic surface; and contacting the first hydrophilic surface with the second hydrophilic surface, on at least one of which the specific molecule is deposited, whereby the two hydrophilic surfaces are bonded one with the other, the specific molecule being disposed between the two hydrophilic surfaces at the amount configured to improve the bonding, and the first substrate and the second substrate are assembled with improved bonding via the specific molecule.

2. The method of bonding according to claim 1, wherein, after contacting the first hydrophilic surface with the second hydrophilic surface, the method comprises a step of application of a bonding annealing heat treatment.

3. The method of bonding according to claim 2, wherein the bonding annealing heat treatment is at a temperature less than or equal to 500° C.

4. The method of bonding according to claim 1, wherein the specific molecule is deposited on the first hydrophilic surface and on the second hydrophilic surface.

5. The method according to claim 1, wherein the specific molecule completely covers the first hydrophilic surface.

6. The method of bonding according to claim 1, wherein the specific molecule completely covers the second hydrophilic surface.

7. The method of bonding according to claim 1, wherein the specific molecule covers from 0.05% to 10% of the first hydrophilic surface or of the second hydrophilic surface.

8. The method of bonding according to claim 7, wherein the specific molecule covers from 0.05% to 1% of the first hydrophilic surface or of the second hydrophilic surface.

9. The method of bonding according to claim 1, wherein the specific molecule is deposited in liquid form.

10. The method of bonding according to claim 1, wherein the specific molecule is deposited in gaseous form.

11. The method of bonding according to claim 1, wherein the hydrophilic functional group of the specific molecule is an alcohol function.

12. The method of bonding according to claim 1, wherein the basic functional group is a primary, secondary or tertiary amine.

13. The method of bonding according to claim 1, wherein the molar mass of the specific molecule is less than or equal to 500 g/mol.

14. The method of bonding according to claim 1, wherein the molar mass of the specific molecule is less than or equal to 200 g/mol.

15. The method according to claim 1, wherein the first substrate or the second substrate is a silicon substrate.

16. The method according to claim 1, wherein the first hydrophilic surface or the second hydrophilic surface is made of oxide.

17. The method according to claim 16, wherein the first hydrophilic surface or the second hydrophilic surface is deposited oxide, thermal oxide or native oxide.

18. The method according to claim 1, wherein the specific molecule is chemisorbed on the first hydrophilic surface and/or the second hydrophilic surface.

19. The method of claim 1, wherein the the amount configured to improve bonding is sufficient to increase a bonding energy between the two hydrophilic surfaces at a temperature less than 500° C.

* * * * *